United States Patent [19]
Cha et al.

[11] Patent Number: 5,746,883
[45] Date of Patent: May 5, 1998

[54] APPARATUS FOR BONDING SEMICONDUCTOR WAFERS

[75] Inventors: Gi-ho Cha, Suwon; Chi-jung Kang, Seoul; Byung-hun Lee, Kyungki-do; Kyung-wook Lee, Seongnam, all of Rep. of Korea

[73] Assignee: Samsung Electronics Co., Ltd., Suwon, Rep. of Korea

[21] Appl. No.: 723,239

[22] Filed: Sep. 27, 1996

[30] Foreign Application Priority Data

Sep. 29, 1995 [KR] Rep. of Korea ............... 95-32978
Sep. 29, 1995 [KR] Rep. of Korea ............... 95-38997

[51] Int. Cl.$^6$ ............................. B32B 31/00; H01L 21/00
[52] U.S. Cl. ..................... 156/580; 156/581; 156/583.8
[58] Field of Search .................................. 156/580, 581, 156/583.6, 583.8, 87, 281, 358

[56] References Cited

FOREIGN PATENT DOCUMENTS 82968   1/1954   Norway ....................... 156/580

OTHER PUBLICATIONS

Haisma, J., et al. "Silicon–on–Insulator Wafer Bonding–Wafer Thinning Technological Evaluations," Japanese Journal of Applied Physics, Vol. 28, No. 8, Aug. 1989, pp. 1426–1443.

Primary Examiner—Jeff H. Aftergut
Attorney, Agent, or Firm—Jones & Volentine, L.L.P.

[57] ABSTRACT

An apparatus for bonding semiconductor wafers firmly bonds the wafers to each other and can always lay the bonded wafers on a desired bonding plate. The bonding plates have a plurality of grooves formed on their respective surfaces to reduce the bond force between the wafers and the bonding plates of the apparatus, and to prevent the wafers from sliding off the plates due to an air cushion. An interval controlling pin projects from the surface of one of the bonding plates to reduce breakage of the wafers by maintaining an interval between the bonding plates as they are are rotated towards each other. An elastic pad portion is installed on one the bonding plates for providing an elastic force for the wafers placed on the bonding plates so that the wafers bond to each other properly when the bonding plates are further rotated towards each other.

24 Claims, 3 Drawing Sheets

APPARATUS FOR BONDING SEMICONDUCTOR WAFERS

BACKGROUND OF THE INVENTION

1. Field of the Invention

The present invention relates to an apparatus for bonding semiconductor wafers. More particularly, the invention relates to an apparatus for bonding two semiconductor wafers to each other for manufacturing a silicon on insulator (SOI) substrate.

2. Description of the Related Art

Generally, a semiconductor device having multiple transistors is formed on a wafer composed of a single-crystal silicon. The electrical characteristics of a transistor formed on a single-crystal silicon wafer are superior, allowing for the manufacture of high performance semiconductor devices.

As the integration density of a semiconductor device increases and the operating speed of the semiconductor device gets faster, power consumption characteristics of the semiconductor device need to be considered. Most of the semiconductor devices which are presently produced employ a complementary MOS circuit (hereinafter, CMOS circuit) having superior power consumption characteristics. When used herein, the term CMOS circuit refers to the circuit consisting of a NMOS transistor and a PMOS transistor.

When a semiconductor device having a CMOS circuit is manufactured on a single-crystal silicon wafer, superior power consumption characteristic can be obtained. Unfortunately, in such a device, latch-up is unavoidable. Latch-up is a phenomenon that establishes a very low-resistance path between the $V_{DD}$ and $V_{SS}$ power lines, which allows large currents to flow through the circuit. This can cause the circuit to cease functioning or can even destroy the circuit due to heat damage from high power heat dissipation. When such a latch-up phenomenon is generated, the desirable characteristic of the semiconductor device cannot be obtained due to the malfunction of the CMOS circuit.

To prevent latch-up, a method of forming the semiconductor device started to appear which consists of forming the CMOS circuit on the SOI substrate to prevent latch-up. When the CMOS circuit consisting of the NMOS and the PMOS transistors is formed on the SOI substrate, the parasitic bipolar transistor is not formed since the NMOS and the PMOS transistors can be completely insulated electrically. As described above, when the CMOS circuit is formed on the SOI substrate, a highly reliable semiconductor device can be made since the above latch-up phenomenon is prevented.

However, there are many difficulties in manufacturing the SOI substrate corresponding to the conventional single-crystal silicon wafer. One of the methods of manufacturing the SOI substrate having a predetermined thickness includes the step of aligning two silicon wafers having thin oxide films formed thereon and bonding the two aligned silicon wafers. Such a process also includes the steps of annealing the two bonded silicon wafers using thermal or electrical energy to keep them from being separated by external forces, and of grinding one of the two annealed silicon wafers to a predetermined thickness. In such a method the steps of aligning and bonding the two silicon wafers are performed by applying appropriate force using an apparatus for bonding wafers so that a cavity is not formed between the two wafers.

FIGS. 1 and 2 are plan and front views describing a conventional apparatus for bonding wafers including a pair of rollers 11 and 12 sharing the same shaft and rotating in opposing directions by a stepping motor (not shown), and bonding plates 13 and 14 fixedly installed to the rollers 11 and 12, respectively. As illustrated in FIGS. 1 and 2, the surfaces of the bonding plates 13 and 14 are smooth. Also formed in bonding plates 13 and 14 are a pair of U-shaped slits 13a and 14a, through which robotic arms (not shown) are inserted for transferring the wafers 15a and 15b from the outside to the bonding plates 13 and 14.

FIG. 2 shows the state of the process wherein the wafers 15a and 15b are loaded on the bonding plates 13 and 14. When the wafers 15a and 15b are loaded on the bonding plates 13 and 14, they may slide off the slippery surfaces of the bonding plates 13 and 14 due to an air cushion under the wafers. Therefore, it is difficult to load and maintain the wafers 15a and 15b on desired positions of the bonding plates 13 and 14.

FIG. 3 is a front view for illustrating a portion of a process for bonding the two wafers 15a and 15b loaded in the apparatus for bonding the wafers of FIG. 2 and thereafter laying the bonded wafers on the desired bonding plate 13 or 14. More specifically, FIG. 3 shows the wafers after they have been bonded.

In the conventional wafer bonding process, wafers 15a and 15b, which are loaded on the bonding plates 13 and 14, are moved close together by rotating the bonding plates 13 and 14 upwardly towards each other by 87°, respectively, so that the bonding plates 13 and 14 are near vertical. The wafers 15a and 15b are aligned by a side aligner (not shown). Then, the bonding plates 13 and 14 are additionally rotated in the same direction so that the aligned wafers 15a and 15b are completely bonded to each other. The rollers 11 and 12 are rotated further to exert a certain force on the wafers 15a and 15b. At this step it is very important that the additional rotation be controlled because the wafers 15a and 15b can be damaged if an excess force is applied thereto, but the wafers 15a and 15b will not completely bond to each other if the force is insufficient. In the conventional apparatus the degree of the additional rotation is controlled by a digital signal, namely, a pulse signal, in which one pulse signal rotates the rollers 11 and 12 approximately 0.72°.

However, the additional rotation degree changes minutely after disassembling and assembling the respective parts to fix the apparatus for bonding the wafers. Therefore, whenever the apparatus is fixed, the bond state of the wafers should be checked after bonding the wafers to recalculate the additional rotation degree.

Assuming that the degree of rotation is controlled and calculated properly and the wafers 15a and 15b bond to each other properly, the bonding plates 13 and 14 are then rotated away from each other (see FIG. 3) to lay down the bonded wafers 15a and 15b on the desired bonding plate 13. However, the bonded wafers 15a and 15b may lay down on the other bonding plate. This is because the bonded wafers 15a and 15b are not easily separated from the bonding plates 13 and 14 since there is not a space between the bonded wafers and the bonding plates.

As described above, in the conventional apparatus for bonding the wafers, there are problems with (1) the wafers sliding off the bonding plates during loading, (2) the degree of additional rotation which must be recalculated and controlled after a maintenance operation is performed on the apparatus, and (3) the bonded wafers may lay on the undesired bonding plate after the wafers are bonded to each other.

SUMMARY OF THE INVENTION

Accordingly, it is an object of the present invention to provide an apparatus for bonding semiconductor wafers which firmly bond the wafers to each other and which can always lay the bonded wafers on the desired bonding plate.

To achieve the above object, there is provided an apparatus for bonding semiconductor wafers according to a first embodiment of the present invention, comprising: a stepping motor; a first roller and a second roller which share the same axis and which are rotated in opposing directions by the stepping motor; a first bonding plate and a second bonding plate which are attached to rotate with the first roller and the second roller, respectively, and on which wafers are placed and wherein a plurality of grooves are formed on the respective surfaces of the first bonding plate and the second bonding plates on which the wafers are placed; an interval controlling pin projecting from the surface of the first bonding plate or of the second bonding plate to maintain a certain interval between the bonding plates when the rollers are rotated in a manner to cause the bonding plates to rotate towards each other; and an elastic pad portion installed on the first bonding plate or on the second bonding plate which is adapted to provide an elastic force for the wafers placed on the bonding plates to provide for the wafers being bonded to each other properly when the first roller and the second roller are further rotated.

According to the first embodiment of the present invention, the wafers are firmly bonded to each other and the bonded wafers always lay down on a desired bonding plate.

To achieve the above object, there is also provided an apparatus for bonding semiconductor wafers according to a second embodiment of the present invention comprising: a stepping motor; a first driving shaft and a second driving shaft which are respectively connected to the stepping motor, share the same axis, and rotate in opposing directions; a first roller and a second roller which are fixed to and rotate with the first driving shaft and the second driving shaft, respectively; a third driving shaft installed between the first driving shaft and the second driving shaft; a third roller and a fourth roller, which are in contact with the third driving shaft and are installed between the first roller and the second roller, respectively; a fifth roller which has a larger diameter than those of the first through fourth rollers and is in contact with the third driving shaft between the third roller and the fourth roller; a first bonding plate which is attached to the first and fourth rollers and whereon wafers are placed; a second bonding plate which is attached to the second and third rollers and whereon wafers are placed; and a fixing pin for connecting the third through fifth rollers so that the fifth roller rotates whenever the third roller rotates.

According to the second embodiment of the present invention, the bonded wafers always lay down on the second bonding plate by connecting, with the fixing pin, the fifth roller which has the largest diameter and the third roller.

BRIEF DESCRIPTION OF THE DRAWINGS

The above objects and advantages of the present invention will become more apparent by the detailed description of preferred embodiments below, and by referring to the attached drawings, in which.

DETAILED DESCRIPTION OF THE INVENTION

Hereinafter, preferred embodiments according to the present invention will be described in detail with reference to FIGS. 4 through 8.

Figure 1:
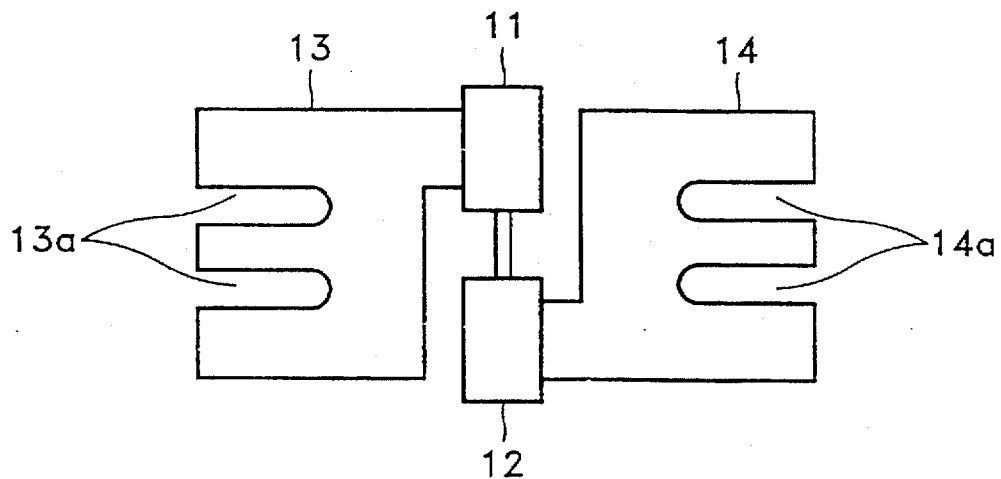
FIG. 1 is a plan view of a conventional apparatus for bonding semiconductor wafers.
Figure 2:
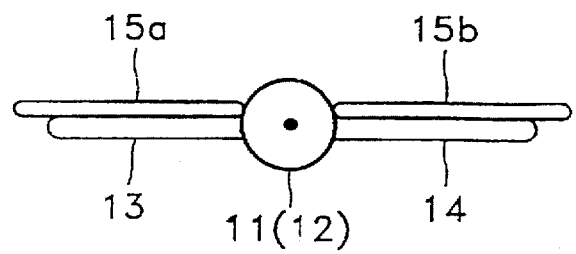
FIGS. 2 and 3 are front views of the apparatus of FIG. 1 at certain process stages for bonding semiconductor wafers.
Figure 3:
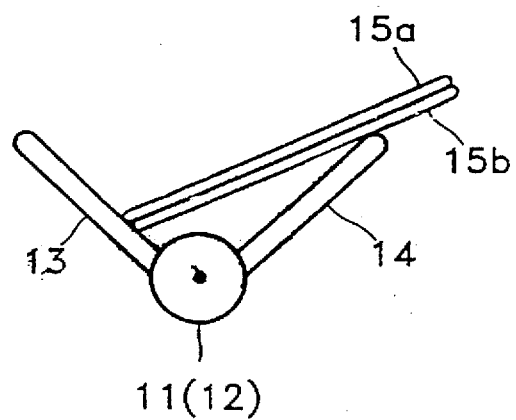
Figure 4:
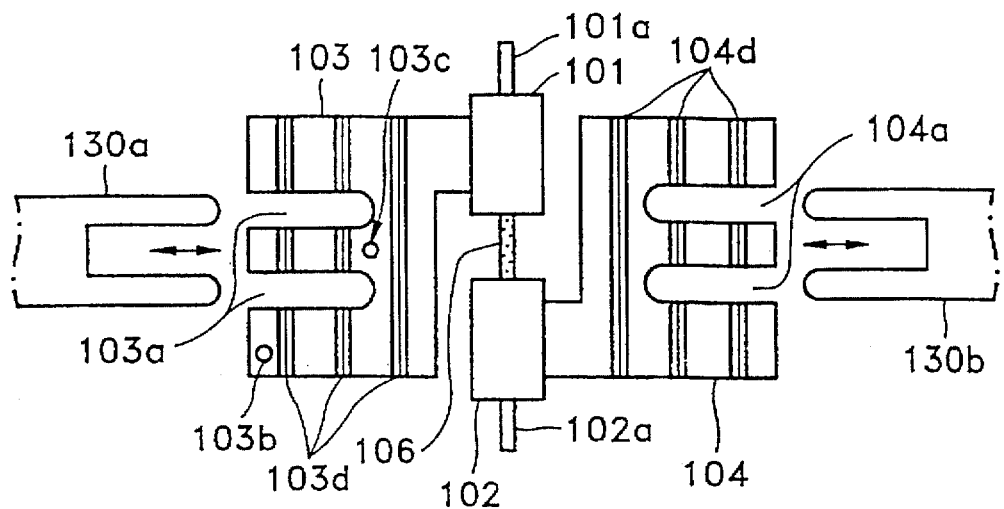
FIG. 4 is a plan view of an apparatus for bonding semiconductor wafers according to a first preferred embodiment of the present invention.
Figure 5:
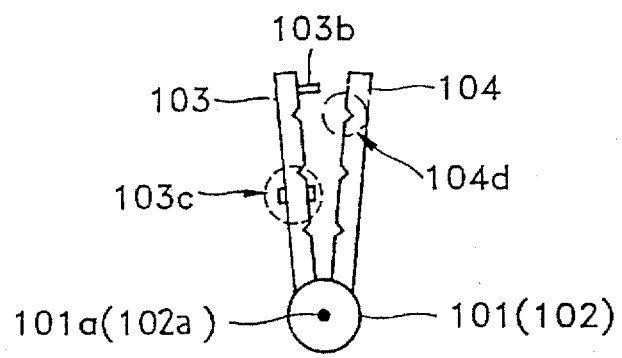
FIG. 5 is a front view of the apparatus of FIG. 4 for bonding semiconductor wafers.
Figure 6:
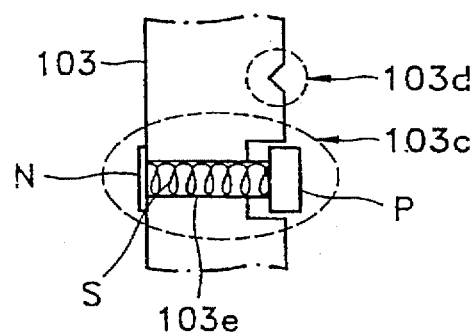
FIG. 6 is a magnified sectional view showing an elastic pad portion of FIG. 5.

FIGS. 4 through 6 describe an apparatus for bonding semiconductor wafers according to a first embodiment of the present invention including; a first driving shaft 101a and a second driving shaft 102a, with each being connected to a stepping motor (not shown) and sharing the same axis and which rotate in opposing directions; a first roller 101 and a second roller 102 which are fixed to the first driving shaft 101a and to the second driving shaft 102a, respectively, and which rotate with the first driving shaft 101a and the second driving shaft 102a; a third driving shaft 106 installed between the first driving shaft 101a and the second driving shaft 102a and which supports the first roller 101 and the second roller 102 to permit them to rotate on the same axis; and a first bonding plate 103 and a second bonding plate 104 fixedly installed to the first roller 101 and the second roller 102, respectively.

Slits 103a and 104a are formed in bonding plate 103 and bonding plate 104, respectively, for insertion of robotic arm 130a and robotic arm 130b, respectively. An interval controlling pin 103b is located at a predetermined portion of the bonding plate 103 and projects from the surface of the first bonding plate 103. An elastic pad portion 103c is installed in the middle of one of the first and second bonding plates for applying a certain force to the middle portion of the wafer during the bonding of two wafers. A plurality of grooves 103d and grooves 104d are formed on the respective surfaces of the first bonding plate 103 and the second bonding plate 104.

When bonding plate 103 and bonding plate 104 rotate towards each other, the interval separating plates 103 and 104 is controlled by the interval controlling pin 103b. In this embodiment it is preferable that the length of the interval controlling pin 103b be adjustable, for example, by a screw structure. It is preferable to control the length of the interval controlling pin 103b so that the protrusion length corresponds to the thickness of the two bonded wafers. It is also preferable that the interval controlling pin 103b be made of a synthetic resin to prevent scratches or particles from being generated when bonding the second bonding plate 104.

As shown in FIG. 5, the interval between the first bonding plate 103 and the second bonding plate 104 can be uniformly maintained to avoid excessive rotation of plates 103 and 104 by appropriately installing the interval controlling pin 103b on the first bonding plate 103.

The plurality of grooves 103d and grooves 104d on the surfaces of bonding plate 103 and bonding plate 104, respectively, allow air between the wafers and the bonding plates to be discharged to the sides when the wafers first are placed on bonding plate 103 and on bonding plate 104, thereby preventing the wafers from sliding off the plates due to an air cushion. Also, grooves 103d and grooves 104d markedly reduce the bond force between the wafers and either of bonding plate 103 or bonding plate 104, thus facilitating the separation of the wafers from the bonding plates.

In FIG. 4, robotic arm 130a and robotic arm 130b are shown, which are adapted for loading and unloading the wafers on the first bonding plate 103 and the second bonding plate 104. In this embodiment, robot arm 130a and robot arm 130b each move in the directions indicated by the bi-directional arrows to facilitate loading and unloading the wafers.

Referring to FIG. 6, the elastic pad portion 103c consists of a spring bearing plate N, attached to the outer edge of plate 103, a spring S of which a first end is attached to the bearing plate N passing through a hole 103e formed in the middle portion of the first bonding plate 103, and a pad P attached to the second end of the spring S slightly protruding past the inner surface of bonding plate 103. The pad P is elastically biased by the spring S. Thus, when the first bonding plate 103 and second bonding plate 104 approach each other, an elastic force is exerted pushing the wafers closer together.

The process of bonding two wafers using the apparatus for bonding the semiconductor wafers is as follows.

First, when the first bonding plate 103 and the second bonding plate 104 rotate towards each other, the length of the interval controlling pin 103b is appropriately controlled to always maintain at least a certain interval between the first bonding plate 103 and second bonding plate 104. Then, bonding plate 103 and bonding plate 104 are spread open for loading of the wafers on bonding plate 103 and on bonding plate 104 by using the robotic arm 130a and robotic arm 130b. At this time, the wafers do not slide off the bonding plate 103 and bonding plate 104 due to the grooves 103d and grooves 104d formed on the surfaces of bonding plate 103 and bonding plate 104. Then, first roller 101 and second roller 102 each are rotated approximately 80°–87° so that bonding plate 103 and bonding plate 104 rotate towards each other. At that time the wafers are aligned to bond properly with each other by a side aligner (not shown).

Subsequently, bonding plate 103 and bonding plate 104 are further rotated. In this embodiment the interval between bonding plate 103 and bonding plate 104 remains the same due to the interval controlling pin 103b even though the degree of further rotation varies due to the imprecise operation of the stepping motor. Maintaining such interval control prevents the wafers from being damaged by the application of excessive force to them.

As described above, when bonding plate 103 and bonding plate 104 are further rotated, the aligned wafers are completely bonded by the elastic force of the elastic pad portion 103c. At this time, since the elastic pad portion 103c exerts force to the middle portion of the wafers, the wafers can be firmly bonded without any air pockets between them.

After the wafers are bonded to each other, the first roller 101 and second roller 102 are slowly rotated in the opposite directions to open bonding plate 103 and bonding plate 104 to their initial positions. At this time, the two bonded wafers always lay down on the second bonding plate 104 because the elastic force of the elastic pad portion 103c pushes the bonded wafers toward the second bonding plate 104. Also, the grooves 103d formed on the surface of the first bonding plate 103 enable the bonded wafers to easily separate from the surface of the first bonding plate 103.

Finally, the bonded wafers on the second bonding plate 104 are unloaded by the second robotic arm 130b.

As described above, according to the first embodiment of the present invention, grooves 103d and grooves 104d are formed on the surfaces of the first bonding plate 103 and the second bonding plate 104 which prevent the wafers from sliding off bonding plate 103 and bonding plate 104 due to an air cushion between each of the wafers and the respective surfaces of either bonding plate 103 or bonding plate 104. Also, an interval controlling pin 103b installed on at least one bonding plate 103 (104) prevents excessive force from being applied to the wafers when the two wafers are bonded to each other. Therefore, the wafers are prevented from being damaged and it is unnecessary to recalculate the degree of further rotation of the stepping motor for each process after fixing or adjusting the apparatus. Also, by installing the elastic pad portion 103c on one bonding plate, the wafers firmly bond to each other and the two bonded wafers are always placed on the proper bonding plate.

Figure 7:
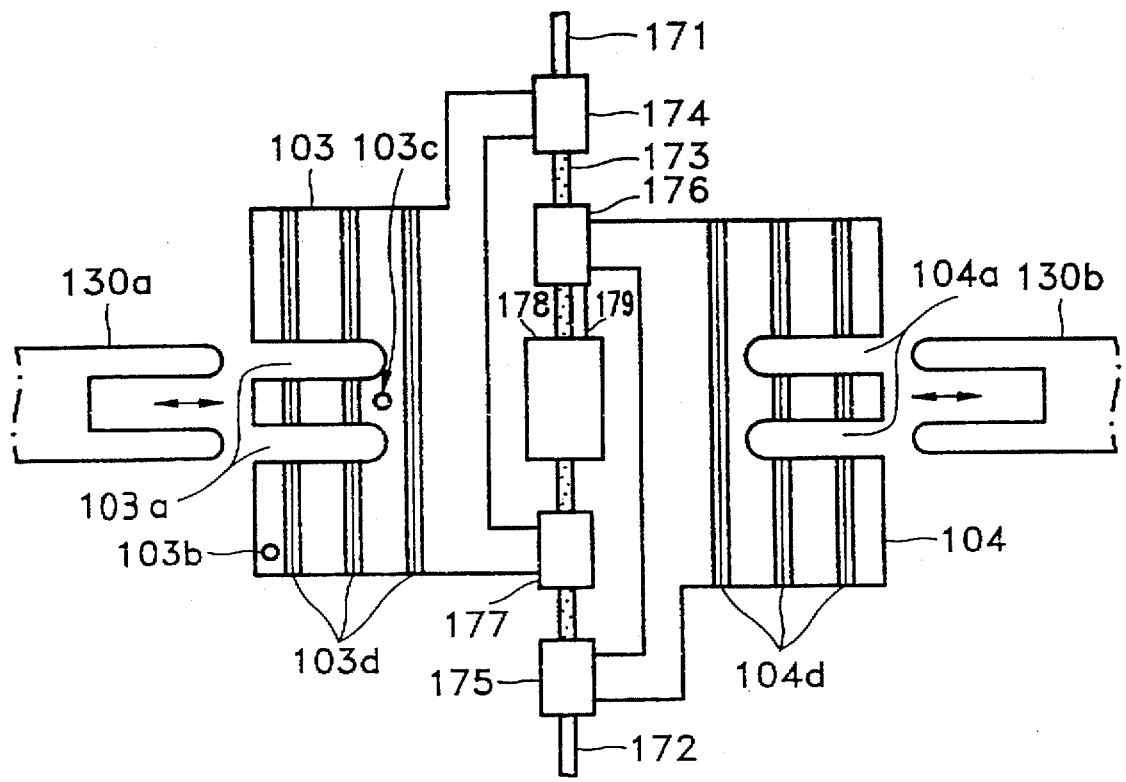
FIG. 7 is a plan view of an apparatus for bonding semiconductor wafers according to a second preferred embodiment of the present invention.
Figure 8:
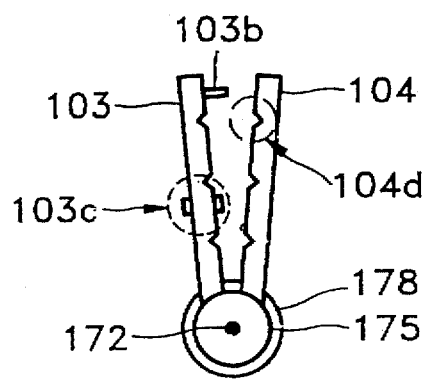
FIG. 8 is a front view of the apparatus of FIG. 7 for bonding semiconductor wafers.

FIGS. 7 and 8 describe the apparatus for bonding the semiconductor wafers according to a second embodiment of the present invention. In FIGS. 7 and 8, the same reference numerals and symbols as those of FIGS. 4 through 6 indicate like elements having identical functions.

Referring to FIGS. 7 and 8, the bonding apparatus according to the second embodiment includes a first driving shaft 171 and a second driving shaft 172, each being connected to a stepping motor (not shown) and rotatable in opposing directions on the same axis; a third driving shaft 173 installed between the first driving shaft 171 and the second driving shaft 172 (the third driving shaft 173 may be installed to rotate with either the first driving shaft 171 or the second driving shaft 172 or to have no relation to the rotations of either of the first driving shaft 171 or the second driving shaft 172); first roller 174 and second roller 175 are fixed to and rotate with driving shaft 171 and driving shaft 172, respectively; a third roller 176 and a fourth roller 177 are connected to the third driving shaft 173 and installed between the first roller 174 and second roller 175; a fifth roller 178 is connected to the third driving shaft 173 between third roller 176 and fourth roller 177; a first bonding plate 103 fixed to the first roller 174 and the fourth roller 177; and a second bonding plate 104 fixed to the second roller 175 and to the third roller 176.

A fixing pin 179 connects the third roller 176 and the fifth roller 178 and rotates them together. Slits 103a and 104a are formed in bonding plate 103 and bonding plate 104, respectively, for insertion of robotic arm 130a and robotic arm 130b, respectively. An interval controlling pin 103b is located at a predetermined portion of the bonding plate 103 and projects from the surface of the first bonding plate 103. A plurality of grooves 103d and grooves 104d are formed on the respective surfaces of first bonding plate 103 and second bonding plate 104. An elastic pad portion 103c is installed in the middle of the first bonding plate 103.

The diameter of fifth roller 178 is larger than those of the first to fourth rollers (rollers 174, 175, 176, and 177, respectively). The third through fifth rollers (rollers 176, 177, and 178, respectively) are in contact with the third driving shaft 173 but are not affected by the rotation of the third driving shaft 173 due to a bearing (not shown) being installed at the contact portion with the third driving shaft 173. Therefore, the third roller 176 and the fourth roller 177 always rotate with the second roller 175 and first roller 174, respectively.

The process of bonding the two wafers by using the apparatus for bonding the semiconductor wafers according to the second embodiment of the present invention having the structure described above is described as follows.

As in the first embodiment, first bonding plate 103 and second bonding plate 104 are opened flat and the wafers are loaded on bonding plate 103 and bonding plate 104, respectively, using the first robotic arm 130a and second robotic arm 130b. In this embodiment the respective wafers are loaded on bonding plate 103 and bonding plate 104 in such a manner that the flat zone regions of the wafers face the fifth roller 178. Then, bonding plate 103 and bonding plate 104 are rotated upwardly towards one another approximately 80°–87°. As the bonding plate 103 and bonding plate 104 rotate towards each other, the flat zone regions of the two wafers contact the fifth roller 178. At that time the wafers are aligned by the side aligner (not shown). Finally, bonding plate 103 and bonding plate 104 are further rotated to bond the aligned wafers to each other.

After the wafers are bonded to each other, the first roller 174 and second roller 175 are slowly rotated in their opposite directions to open the bonding plates back to their initial positions. At this time, as the fifth roller 178 rotates with the second bonding plate 104 in the same direction, the bonded wafers which are in contact with the fifth roller 178 lay down on the second bonding plate 104. Then, the bonded wafers on the second bonding plate 104 are unloaded by the second robotic arm 130b.

As described above, according to the second embodiment of the present invention, errors do not occur in unloading the bonded wafers since the bonded wafers will always lay down on a predetermined bonding plate.

While this invention has been described with respect to that which is presently considered to be the most practical and preferred embodiments, it is to be understood that the invention is not limited to the disclosed embodiments. On the contrary, it is intended that the present invention cover various modifications and equivalent arrangements within the spirit and scope of the appended claims.

What is claimed is:

1. An apparatus for bonding semiconductor wafers, comprising:
    a stepping motor;
    a first roller and a second roller which share a same axis and rotate in opposing directions by said stepping motor; and
    a first bonding plate and a second bonding plate attached to and rotating with said first roller and said second roller, respectively, and on which wafers are placed, wherein a plurality of grooves are formed on respective surfaces of said first bonding plate and said second bonding plate on which the wafers are placed.

2. An apparatus as claimed in claim 1, said apparatus further comprising an interval controlling pin projecting from the surface of one of said first bonding plate and said second bonding plate for maintaining an interval between said bonding plates when said rollers are rotated in such a manner that said bonding plates are rotated towards each other.

3. An apparatus as claimed in claim 2, wherein said interval controlling pin has an adjustable length.

4. An apparatus as claimed in claim 3, wherein said adjustable length of said interval controlling pin corresponds to a thickness of the two bonded wafers.

5. An apparatus as claimed in claim 4, wherein said interval controlling pin is a screw structure.

6. An apparatus as claimed in claim 5, wherein said interval controlling pin is composed of a synthetic resin.

7. An apparatus as claimed in claim 1, said apparatus further comprising an elastic pad portion installed on one of said first bonding plate and said second bonding plate for providing an elastic force for the wafers placed on said bonding plates so that the wafers bond to each other properly when the first roller and the second roller are rotated in such a manner that said bonding plates are rotated towards each other.

8. An apparatus as claimed in claim 2, said apparatus further comprising an elastic pad portion installed on one of said first bonding plate and said second bonding plate for providing an elastic force for the wafers placed on said bonding plates so that the wafers bond to each other properly when the first roller and the second roller are rotated in such a manner that said bonding plates are rotated towards each other.

9. An apparatus as claimed in claim 7, said elastic pad portion comprising:
    a spring having a first end connected to one of said bonding plates; and
    a pad connected to a second end of said spring.

10. An apparatus as claimed in claim 9, wherein said pad is elastically biased by said spring, and said pad protrudes slightly past an inner surface of one of said first and second bonding plates.

11. An apparatus as claimed in claim 8, said elastic pad portion comprising:
    a spring having a first end connected to one of said bonding plates; and
    a pad connected to a second end of said spring.

12. An apparatus as claimed in claim 11, wherein said pad is elastically biased by said spring, and said pad protrudes slightly past an inner surface of one of said first and second bonding plates.

13. An apparatus for bonding semiconductor wafers, comprising:
    a stepping motor;
    a first driving shaft and a second driving shaft which are respectively connected to said stepping motor, share a same axis, and rotate in opposing directions;
    a first roller and a second roller which are fixed to and rotate with said first driving shaft and said second driving shaft, respectively;
    a third driving shaft installed between said first driving shaft and second driving shaft;
    a third roller and a fourth roller contacting said third driving shaft and which are installed between said first roller and said second roller, respectively;
    a fifth roller having a larger diameter than those of said first, second, third and fourth rollers, which is in contact with said third driving shaft between said third roller and said fourth roller;
    a first bonding plate attached to said first roller and said fourth roller and whereon a first wafer is placed;
    a second bonding plate attached to said second roller and said third roller and whereon a second wafer is placed; and
    a fixing pin for connecting said third roller to said fifth roller, such that said fifth roller rotates with said third roller.

14. An apparatus as claimed in claim 13, wherein each of said first bonding plate and said second bonding plate have a plurality of grooves on a surface thereof.

15. An apparatus as claimed in claim 13, said apparatus further comprising an elastic pad portion installed on one of said first bonding plate and said second bonding plate, for providing an elastic force for the first and second wafers placed on said bonding plates, whereby the wafers bond to each other properly when said first roller and said second roller are rotated in such a manner that said bonding plates are rotated towards each other.

16. An apparatus as claimed in claim 14, said apparatus further comprising an elastic pad portion installed on one of said first bonding plate and said second bonding plate, for providing an elastic force for the first and second wafers placed on said bonding plates, whereby the wafers bond to each other properly when said first roller and said second roller are rotated in such a manner that said bonding plates are rotated towards each other.

17. An apparatus as claimed in claim 15, said elastic pad portion comprising:
   a spring having a first end connected to one of said bonding plates; and
   a pad connected to a second end of said spring.

18. An apparatus as claimed in claim 17, wherein said pad is elastically biased by said spring, and said pad protrudes slightly past an inner surface of one of said bonding plates.

19. An apparatus as claimed in claim 16, said elastic pad portion comprising:
   a spring having a first end connected to one of said bonding plates; and
   a pad connected to a second end of said spring.

20. An apparatus as claimed in claim 19, wherein said pad is elastically biased by said spring, and said pad protrudes slightly past an inner surface of one of said bonding plates.

21. An apparatus as claimed in claim 15, said apparatus further comprising an interval controlling pin projecting from the surface of one of said first bonding plate and said second bonding plate for maintaining an interval between said bonding plates when said rollers are rotated in such a manner that said bonding plates are rotated towards each other.

22. An apparatus as claimed in claim 16, said apparatus further comprising an interval controlling pin projecting from the surface of one of said first bonding plate and said second bonding plate for maintaining an interval between said bonding plates when said rollers are rotated in such a manner that said bonding plates are rotated towards each other.

23. An apparatus for bonding semiconductor wafers, comprising:
   a stepping motor;
   a first roller and a second roller which share a same axis and rotate in opposing directions by said stepping motor;
   a first bonding plate and a second bonding plate attached to and rotating with said first roller and said second roller, respectively, and on which wafers are placed, wherein a plurality of grooves are formed on respective surfaces of said first bonding plate and said second bonding plate on which the wafers are placed;
   an interval controlling pin projecting from the surface of one of said first bonding plate and said second bonding plate for maintaining an interval between said bonding plates when said rollers are rotated in such a manner that said bonding plates are rotated towards each other; and
   an elastic pad portion installed on one of said first bonding plate and said second bonding plate for providing an elastic force for the wafers placed on said bonding plates so that the wafers bond to each other properly when the first roller and the second roller are rotated in such a manner that said bonding plates are further rotated towards each other, said elastic pad portion comprising a spring having a first end connected to one of said bonding plates and a pad connected to a second end of said spring, wherein said pad is elastically biased by said spring, and said pad protrudes slightly past an inner surface of one of said first and second bonding plates.

24. An apparatus for bonding semiconductor wafers, comprising:
   a stepping motor;
   a first driving shaft and a second driving shaft which are respectively connected to said stepping motor, share a same axis, and rotate in opposing directions;
   a first roller and a second roller which are fixed to and rotate with said first driving shaft and said second driving shaft, respectively;
   a third driving shaft installed between said first driving shaft and second driving shaft;
   a third roller and a fourth roller contacting said third driving shaft and which are installed between said first roller and said second roller, respectively;
   a fifth roller having a larger diameter than those of said first, second, third and fourth rollers, which is in contact with said third driving shaft between said third roller and said fourth roller;
   a first bonding plate attached to said first roller and said fourth roller and whereon a first wafer is placed;
   a second bonding plate attached to said second roller and said third roller and whereon a second wafer is placed, wherein each of said first bonding plate and said second bonding plate have a plurality of grooves on a surface thereof;
   a fixing pin for connecting said third roller to said fifth roller, such that said fifth roller rotates with said third roller;
   an interval controlling pin projecting from the surface of one of said first bonding plate and said second bonding plate for maintaining an interval between said bonding plates when said rollers are rotated in such a manner that said bonding plates are rotated towards each other; and
   an elastic pad portion installed on one of said first bonding plate and said second bonding plate, for providing an elastic force for the first and second wafers placed on said bonding plates, whereby the wafers bond to each other properly when said bonding plates are further rotated towards each other, said elastic pad portion comprising a spring having a first end connected to one of said bonding plates and a pad connected to a second end of said spring, wherein said pad is elastically biased by said spring, and said pad protrudes slightly past an inner surface of one of said bonding plates.

* * * * *